United States Patent [19]
Ballard

[11] 3,972,786
[45] Aug. 3, 1976

[54] MECHANICALLY ENHANCED MAGNETIC MEMORY

[75] Inventor: Nathan Thomas Ballard, Santa Monica, Calif.

[73] Assignee: Ampex Corporation, Redwood City, Calif.

[22] Filed: June 28, 1974

[21] Appl. No.: 484,095

[52] U.S. Cl. .............................. 204/32 R; 204/27; 204/43 T; 340/174 TF
[51] Int. Cl.² .................. C25D 5/34; C25D 3/56; G11C 11/02
[58] Field of Search .............. 204/28, 32, 43 T, 29, 204/27, 11, 12; 340/174 TF

[56] References Cited
UNITED STATES PATENTS

| | | |
|---|---|---|
| 3,189,532 | 6/1965 | Chow et al. .......................... 204/28 |
| 3,265,596 | 8/1966 | Castellani et al. .................. 204/43 T |
| 3,704,211 | 11/1972 | Phillips .............................. 204/43 T |
| 3,853,717 | 12/1974 | Diguillo ................................ 204/28 |

*Primary Examiner*—F.C. Edmundson

[57] ABSTRACT

An improved thin film magnetic memory device is fabricated by selective mechanical enhancement of the coercive force and anisotropic characteristics of the thin film magnetic material. The enhancement is produced by polishing the substrate with a fine abrasive in a direction parallel to the desired easy axis of magnetization prior to magnetic film deposition.

3 Claims, 4 Drawing Figures

MECHANICALLY ENHANCED MAGNETIC MEMORY

The invention herein described was made in the course of a contract with the Department of the United States Navy.

SUMMARY OF THE INVENTION

The present invention enables one to produce a magnetic information storage device which is significantly less susceptible to loss of stored information than previous devices, even in the presence of disturbing magnetic influences or wide temperature variations. In accordance with the process of the present invention, a thin film magnetic memory device can be made which is stable from −55° to 150°C whereas previous devices had an upper limit of about 25°C without serious loss of magnetization both during memory operation and non-operating information storage.

According to the present invention a magnetic structure is produced which retains the stored information despite abnormal magnetic field exposures and will retain the information throughout a considerably increased temperature exposure.

In accordance with the present invention a superior magnetic film is made by physically structuring the substrate on which the film is deposited. This is done by polishing the substrate in a single direction with a fine abrasive. This produces a series of striations along the desired easy axis of the magnetic film. The striations are produced on only a relatively small percentage of the total surface of the substrate so that the largest volume of a memory plane has normal characteristics and rotates for readout. However, the grooves parallel to the easy axis promote regions of high coercivity and high anisotropy in the magnetic film and these regions tend to steer other magnetic influences back to the magnetized direction after readout and maintain a state of magnetization even if the memory element is subjected to a high temperature, or the influence of repetitive readout or record current fields. The process of the present invention significantly improves the creep resistance of these types of magnetic structures. The striations provide pinning sites for domain walls. This is a significant element in the improvement of magnetic and temperature related stability.

In accordance with the present invention, the deposited magnetic film can be one which is normally isotropic and achieves its anisotropic properties through the mechanical enhancement. This allows the use of a broad spectrum of film compositions previously unusable for these applications.

In general, the process of the present invention is to provide a substrate of a non-magnetic material such as copper and then subject this to a polishing operation conducted in a single direction with a fine abrasive such as aluminum oxide particles in the micron range. This produces a series of parallel scratches in the copper substrate but the majority of the surface is undisturbed. In other words, the scratches consist of a series of parallel lines with much more space between the lines than that occupied by the lines themselves. These parallel lines are oriented parallel to the desired easy axis of the magnetic film. The magnetic film is then plated onto the polished copper substrate as is hereinafter explained in detail. Since practical memory units often consist of a series of magnetic films, this process may be repeated several times in producing a given structure.

Above a thickness of approximately 1000 A most thin magnetic films will begin to display the magnetic properties associated with a bulk material of the same structure and composition. The typical films such as permalloy which can be produced on unmodified smooth surfaces to display a high degree of anisotropy and low dispersion as required for non-destructive readout will only have an appropriate coercive force at thicknesses of somewhat less than 1000 A. The coercive force of such films increases with decreasing thickness below 1000 A. This means that to balance the required magnetic properties and achieve a thickness appropriate for the output required it was previously necessary to produce multilayer structures with thin isolation layers. In this way sufficient decoupling is achieved to allow the films to retain the coercive force associated with the independent layers, but act in unison in signal production. With the mechanical enhancement technique of the present invention, it is now possible to utilize a magnetic film composition which has an appropriate coercive force as a bulk form characteristic, meaning that this characteristic need not be controlled by film thickness. Film thicknesses in considerable excess of 1000 A can be employed and therefore nearly any desired output can be achieved without resorting to the considerable effort of many steps involved in multilayers. This results in a considerable reduction in labor and cost and improves the process reliability.

DESCRIPTION OF THE PREFERRED EMBODIMENTS

Figure 1:
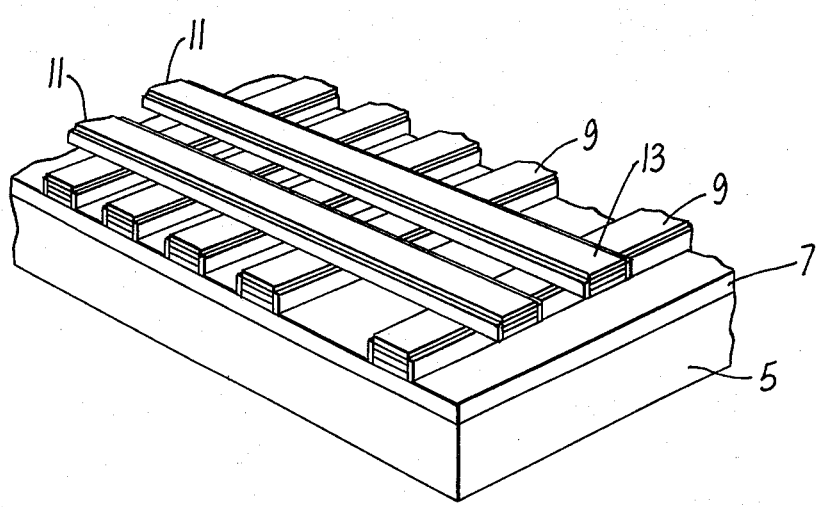
FIG. 1 is a perspective view of an array of closed flux storage cells fabricated in accordance with the present invention.

In FIG. 1 a closed flux memory of the type to which the present invention is applicable is shown. Here a conductive ground plane of a metal such as aluminum 5 is employed having an insulating layer 7 of a plastic such as Kapton. Over this is formed a plurality of digit lines 9 thereon over which are series of word lines 11. It will be understood that at each junction between a word line and a digit line a memory cell will be formed as at 13.

Figure 2:
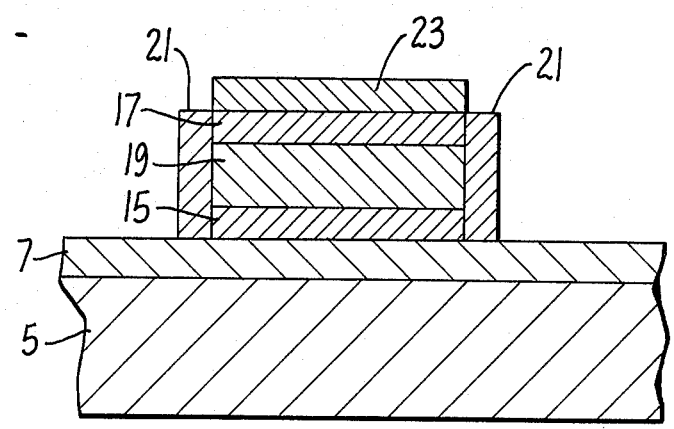
FIG. 2 is an enlarged sectional view of a digit line in the structure of FIG. 1.

In FIG. 2 a cross section of a typical digit line is shown having a bottom magnetic layer 15, and a top magnetic layer 17 separated by a copper conductor 19. Soft magnetic sides 21 are provided on both sides of the magnetic layers to complete the closed flux structure. A photo resist 23 is provided on top of the structure through which the line pattern is etched onto the surface. In a typical structure, the top and bottom magnetic layers 15 and 17 can be from 2,000 to 3,000 A thick but are not limited to this thickness range, while the conductive copper layer is about 50,000 A. The side closures 21 are about the same thickness as the magnetic layers.

Figure 3:
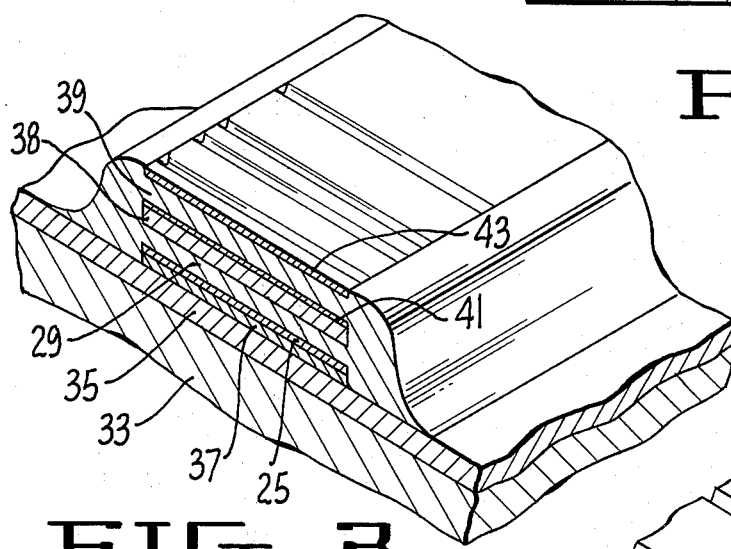
FIG. 3 is a perspective view in section of a mechanically enhanced digit structure.

FIG. 3 shows the completed digit line wherein 33 is an aluminum substrate, 35 is a dielectric plastic material, 37 is a vacuum deposited substrate activation layer and 25 is the polished copper layer previously described while 29 is the magnetic layer previously described. Over this magnetic layer is provided another copper layer 38 which is again polished and plated to provide an enhanced nickel cobalt magnetic layer 39. A nickel phosphrous layer 41 and gold adhesion layer 43 complete the structure.

Figure 4:
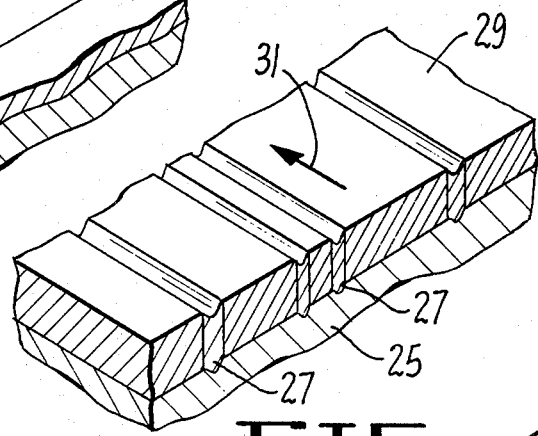
FIG. 4 is a magnified cross section of the enhancement including the magnetic layer.

In FIG. 4 there is shown a magnified cross section of a portion of the digit line shown in FIG. 3 wherein 25 is an electrodeposited copper layer which has been polished to produce a number of striations 27 in the surface thereon. Over this is electroplated a cobalt nickel magnetic layer 29 and the easy axis to the magnetic layer is shown by the arrow 31. Polishing was done with one of the finest available polishing cloths known as Buehlers AB microcloth, and one of the finest available polishing compounds, namely Linde A 0.3u $Al_2O_3$ powder. Polishing is done in one direction to produce the parallel striations 27 and the direction and nature of the striations enhance the anistropy of the subsequent magnetic deposit as well as providing pinning sights or boundries for domain walls.

The plating was deposited from a bath containing:
20 gr/L. $CoSO_4 . 7H_2O$
170 gr/L. $NiSO_4 . 6H_2O$
20 gr/L. $H_3BO_3$
15 gr/L. NaCl
0.3 gr/L. Saccharin
0.4 gr/L. Sodium Lauryl Sulfate Plating was done at a current density of about 50 MA/per square inch with a 5 second on, 30 second off pulse plating procedure and no gas agitation was employed. The nickel cobalt magnetic alloy was deposited to provide a thickness of 2,000 A or more as required for signal and consistency with inter bit disturb thresholds.

It is important that the polishing operation is done in such a manner that not over 10 percent of the surface is abraded. In other words, the surface of the substrate remains about 90 percent intact with polishing grooves between the lands as is shown in FIG. 4. Although not over 10 percent of the surface is abraded, it is necessary to abrade at least 5 percent of the surface, since otherwise the beneficial effect of the mechanical enhancement would be largely lost.

Since we are dealing with relatively small structures, it is important that the abrasive selected be a fine one and it has been found that abrasives having a particle size of from 0.3 to 10 microns are suitable. Aluminum oxide abrasives of various sizes in this range are readily available commercially. In any event, the particle size of the abrasive should not be greater than three times the thickness of the magnetic film which is placed over the polished surface. The depth of the grooves can be equal to or less than the particle size. On the other hand, the magnetic film must not be too thick since the plating tends to be self-leveling and if the thickness of the magnetic film greatly exceeds the particle size of the abrasive, the enhancement due to the polishing will be lost. However, the film can be as thick as five times the size of the abrasive particles. Thus, the thickness of the film should be not less than one/third nor more than five times the particle size. Since the particle size can range, as stated above, from 0.3 to 10 microns, the magnetic film can be from 1000 A to 50 microns so long as the film is not over five times the thickness of the particles.

In order to illustrate the beneficial effects of the present invention, a mechanically-enhanced structure was compared with one which was not mechanically enhanced. Two magnetic memory structures were made, one of which was made in accordance with the description of FIG. 4 wherein the copper layer which forms the base for the memory structure had been mechanically enhanced. The other was identical in structure except that no mechanical enhancement was employed. The memory structures were then tested to determine output at various temperatures. The mechanically enhanced structure of the present invention showed a substantially uniform output at temperatures from $-50°C$ to $150°C$. The structure which had not been mechanically enhanced had substantially no output at temperatures of $50°C$ and higher, and it was considered that it would not be a useful memory structure at temperatures over about $35°C$. Based on accelerated aging tests, it was estimated that the enhanced memory structure would have a useful operating life of about 100 years at $85°C$.

Many variations can be made without departing from the spirit of this invention. Although the substrate has been described as copper, other non-magnetic metals may be used. The memory structure need not be flat but can be in the form of a wire, tube cylinder or the like.

I claim:
1. A process for making a magnetic memory structure wherein a magnetic film is electrodeposited on a non-magnetic metallic substrate comprising the steps of:
   a. polishing said substrate, whereby grooves are formed in said substrate parallel to a desired easy axis of magnetization, said grooves occupying an area of 5 to 10 percent of said substrate,
   b. said grooves being formed with an abrasive having a particle size of from about 0.3 to 10 microns, and
   c. plating a magnetic film over said grooved substrate, said film having a thickness of from one-third to five times the particle size of said abrasive.
2. The process of claim 1 wherein the substrate is copper.
3. The process of claim 1 wherein the magnetic layer is an electrodeposited layer of Ni-Co.

* * * * *